United States Patent
Tu et al.

[11] Patent Number: 5,981,109
[45] Date of Patent: Nov. 9, 1999

[54] USING (LANIO$_3$)$_x$(TIO$^2$)$_{1-x}$ AND (LANIO$_3$)$_x$(TA$_2$O$_5$)$_{1-x}$ OXIDE ABSORPTION COMPOSITES FOR ATTENUATING PHASE SHIFTING BLANKS AND MASKS

[75] Inventors: Chih-Chiang Tu, Tauyen; Jon-Yiew Gan, Chushan; Tai-Bor Wu, Hsinchu; Chao-Chen Cheng, Taipei, all of Taiwan

[73] Assignee: Taiwan Semiconductor Manufacturing Company, Ltd., Hsin-Chu, Taiwan

[21] Appl. No.: 09/015,242

[22] Filed: Jan. 29, 1998

Related U.S. Application Data

[63] Continuation-in-part of application No. 08/682,472, Jul. 17, 1996, Pat. No. 5,714,285.

[51] Int. Cl.$^6$ .................................................. G03F 9/00
[52] U.S. Cl. ............................................................ 430/5
[58] Field of Search ...................................... 430/5

[56] References Cited

U.S. PATENT DOCUMENTS

| | | | |
|---|---|---|---|
| 5,268,244 | 12/1993 | Yoo | 430/5 |
| 5,415,953 | 5/1995 | Alplay et al. | 430/5 |
| 5,609,977 | 3/1997 | Iwamatsu et al. | 430/5 |
| 5,614,335 | 3/1997 | Hashimoto et al. | 430/5 |
| 5,629,115 | 5/1997 | Kawano et al. | 430/5 |
| 5,714,285 | 2/1998 | Tu et al. | 430/5 |

*Primary Examiner*—Mark Chapman
*Attorney, Agent, or Firm*—George O. Saile; Stephen B. Ackerman; Larry J. Prescott

[57] ABSTRACT

An attenuating phase shifting photomask is formed using attenuating phase shifting composite material combining the optical properties of a first material having a high extinction coefficient and a second material having a high index of refraction. The first material is LaNiO$_3$ and the second material is either TiO$_2$ or Ta$_2$O$_5$. The first and second materials are combined to produce composites of either (LaNiO$_3$)$_x$(TiO$_2$)$_{1-x}$ or (LaNiO$_3$)$_x$(Ta$_2$O$_5$)$_{1-x}$ to form attenuating phase shifting blanks and masks. Co-deposition of LaNiO$_3$ and either TiO$_2$ or Ta$_2$O$_5$ uses rf-magnetron sputtering to form the (LaNiO$_3$)$_x$(TiO$_2$)$_{1-x}$ or (LaNiO$_3$)$_x$(Ta$_2$O$_5$)$_{1-x}$ films on a transparent quartz substrate.

17 Claims, 10 Drawing Sheets

USING (LANIO$_3$)$_x$ (TIO$^2$)$_{1-x}$ AND (LANIO$_3$)$_x$ (TA$_2$O$_5$)$_{1-x}$ OXIDE ABSORPTION COMPOSITES FOR ATTENUATING PHASE SHIFTING BLANKS AND MASKS

This is a Continuation-in-Part Application of Serial No. 08/682,475, filed Jul. 17, 1996, entitled "USING (LaNiO$_3$)$_x$ (TiO$_2$)$_{1-x}$ OXIDE ABSORPTION COMPOSITE FOR ATTENUATING PHASE SHIFTING BLANKS AND MASKS", now U.S. Pat. No. 5,714,285.

BACKGROUND OF THE INVENTION

1. Field of the Invention

This invention relates to attenuating phase shifting photomasks and more particularly to the formation of attenuating phase shifting material using a composite of a first material with a high extinction coefficient and a second material with a high index of refraction to achieve desired optical properties. More particularly the first material is LaNiO$_3$ and the second material is either TiO$_2$ or Ta$_2$O$_5$.

2. Description of Related Art

As optical lithography advances to smaller spacings and tighter tolerances phase shifting type photomasks are often used to achieve improved tolerances and pattern edge definition.

U.S. Pat. No. 5,286,244 to Yoo describes methods for making phase shifting photomasks using silicon oxide and silicon nitride materials.

The invention described in this patent application uses the optical properties of (LaNiO$_3$)$_x$(TiO$_2$)$_{1-x}$ or (LaNiO$_3$)$_x$(Ta$_2$O$_5$)$_{1-x}$ oxide absorption composite to form attenuating phase shifting blanks and masks for use in photolithographic processes.

SUMMARY OF THE INVENTION

FIG. 1 shows a block diagram of a conventional reduction stepper for projecting a mask image onto an integrated circuit wafer. A light beam 11 passes through the mask 10 and into the reduction stepper 20, usually a 5 times reduction stepper. The light emerging from the reduction stepper is focussed on the integrated circuit element 30 and the image is formed on the integrated circuit element.

FIG. 2 shows a cross section view of a prior art binary mask, the electric field of the light emerging from the mask, and the intensity of the light at the integrated circuit wafer. The mask comprises a transparent substrate 12 with a pattern formed in a layer of opaque material 14, such as chrome. A beam of light 16 impinges on the binary mask. The electric field, E, of the light exiting the mask and the intensity, I, of the light focused on the integrated circuit wafer is also shown in FIG. 2. As can be seen in FIG. 2 the intensity, I, of the light does not return completely to zero at the position where the electric field, E, of the light emerging from the mask returns to zero resulting in a problem in defining the pattern edge for small pattern spacings.

FIG. 3 shows a cross section view of a prior art attenuating phase shifting mask, the electric field of the light emerging from the mask, and the intensity of the light at the integrated circuit wafer. The mask comprises a transparent substrate 22 with a pattern formed in a layer of attenuating phase shifting material 24, such as CrON or MoSiO. A beam of light 26 illuminates the attenuating phase shifting mask. The electric field, E, of the light exiting the mask and the intensity, I, of the light focused on the integrated circuit wafer is also shown in FIG. 3. As can be seen from the intensity, I, of the light shown in FIG. 3 the definition of the pattern edge is improved with the use of the attenuating phase shifting mask compared to the binary mask shown in FIG. 2.

In forming photomasks which utilize phase shifting techniques it is frequently desirable to use attenuating phase shifting material which will absorb a part of the light incident on the attenuating phase shifting material as well as shift the phase of the light. Frequently the transmission coefficient of the phase shifting material used is too high at long wavelengths making alignment of the mask in the reduction stepper a problem. High transmission coefficients also make inspection for defects at mask manufacture a problem. The transmission of CrON is greater than 0.50 and of MoSiO is greater than 0.30 at the He-Ne LASER wavelength of 623 nanometers.

It is a principle object of this invention to provide a single layer composite attenuating phase shifting material for forming attenuating phase shifting photomasks which has a transmittance of about 0.15 or less for light having a wavelength of about 365 nanometers (i-line) or less and about 0.40 or less for light having a wavelength of about 623 nanometers (He-Ne LASER wavelength) or less.

It is another object of this invention to provide an attenuating phase shifting photomask using a single layer composite attenuating phase shifting material having a transmittance of about 0.15 or less for light having a wavelength of about 365 nanometers or less and about 0.40 or less for light having a wavelength of about 623 nanometers or less.

It is another object of this invention to provide a method of forming a single layer composite attenuating phase shifting material which having a transmittance of about 0.15 or less for light having a wavelength of about 365 nanometers or less and about 0.40 or less for light having a wavelength of about 623 nanometers or less.

These objects are achieved using a layer of (LaNiO$_3$)$_x$(TiO$_2$)$_{1-x}$ or a layer of (LaNiO$_3$)$_x$(Ta$_2$O$_5$)$_{1-x}$ as the attenuation phase shifting material. The layer of (LaNiO$_3$)$_x$(TiO$_2$)$_{1-x}$ the layer of (LaNiO$_3$)$_x$(Ta$_2$O$_5$)$_{1-x}$ is formed on a fused quartz substrate using rf magnetron co-deposition of either LaNiO$_3$ and TiO$_2$ or LaNiO$_3$ and Ta$_2$O$_5$.

DESCRIPTION OF THE PREFERRED EMBODIMENTS

Figure 4:
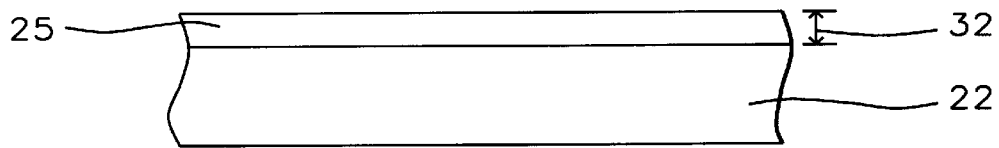
FIG. 4 shows a cross section view of a transparent mask substrate with the attenuating phase shifting material of this invention formed on the transparent mask substrate.
Figure 6:
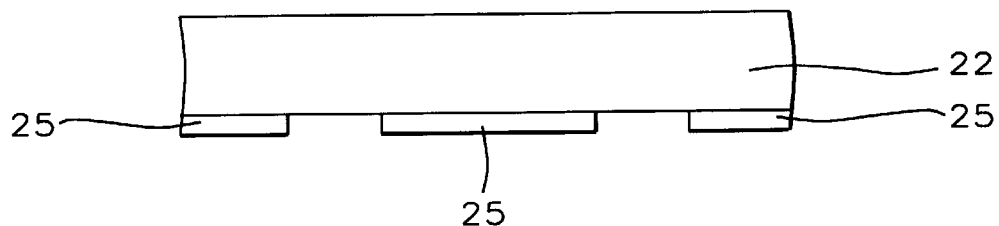
FIG. 6 shows a cross section view of an attenuating phase shifting mask using the attenuating phase shifting material of this invention.

Refer now to FIGS. 4 and 6, there is shown an embodiment of the attenuating phase shifting photomask of this invention. FIG. 4 shows a cross section of a transparent mask substrate 22, such as fused quartz, with a layer of attenuating phase shifting material 25 formed thereon. The attenuating phase shifting material is a composite material comprising a first material, such as $LaNiO_3$, having a large extinction coefficient, k, greater than about 0.8, and a second material, such as $TiO_2$, having a high index of refraction, n, greater than about 2.4. The extinction coefficient, k, is the imaginary part of the index of refraction and is related to the transmission coefficient of the material but does not depend on the material thickness.

The attenuating phase shifting material 25 is an oxide film of composition $(LaNiO_3)_x(TiO_2)_{1-x}$, or LNTO, having a thickness 32 of between about 110 nanometers and 280 nanometers where x is between about 0.5 and 0.8. The two major constituents of the LNTO film are $LaNiO_3$ and $TiO_2$. $LaNiO_3$ has an index of refraction, n, of about 1.8 and an extinction coefficient, k, of about 1.1. $TiO_2$ has an index of refraction, n, of about 2.6 and an extinction coefficient, k, of about 0.01 at the i-line wavelength of 365 nanometers. The $LaNiO_3$ and $TiO_2$ combine to form a LNTO film having an index of refraction between about 2.1 and 2.3 and an extinction coefficient of between about 0.35 and 0.55 for light having a wavelength between about 350 nanometers and 600 nanometers.

Figure 7:
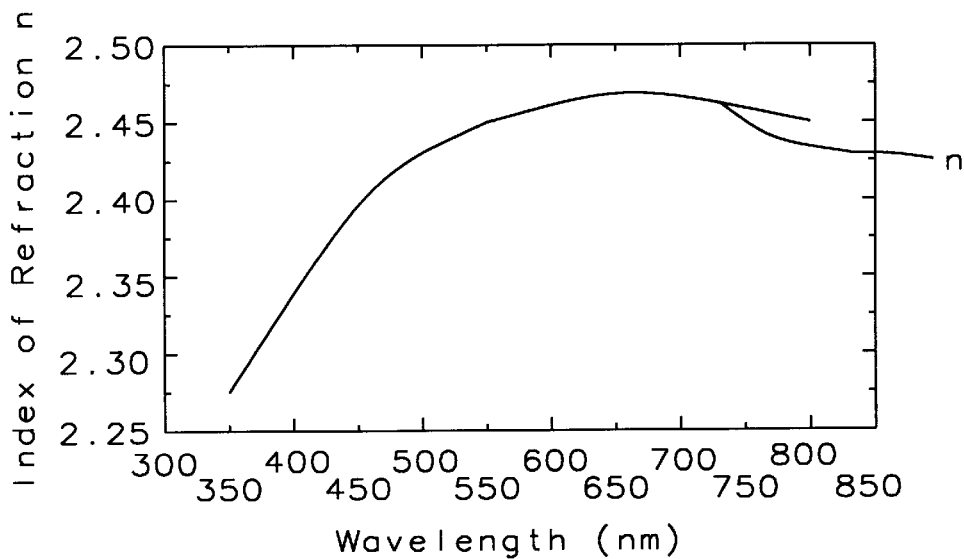
FIG. 7 shows a curve of the index of refraction as a function of light wavelength for a film of (LaNiO$_3$)$_x$(TiO$_2$)$_{1-x}$.
Figure 8:
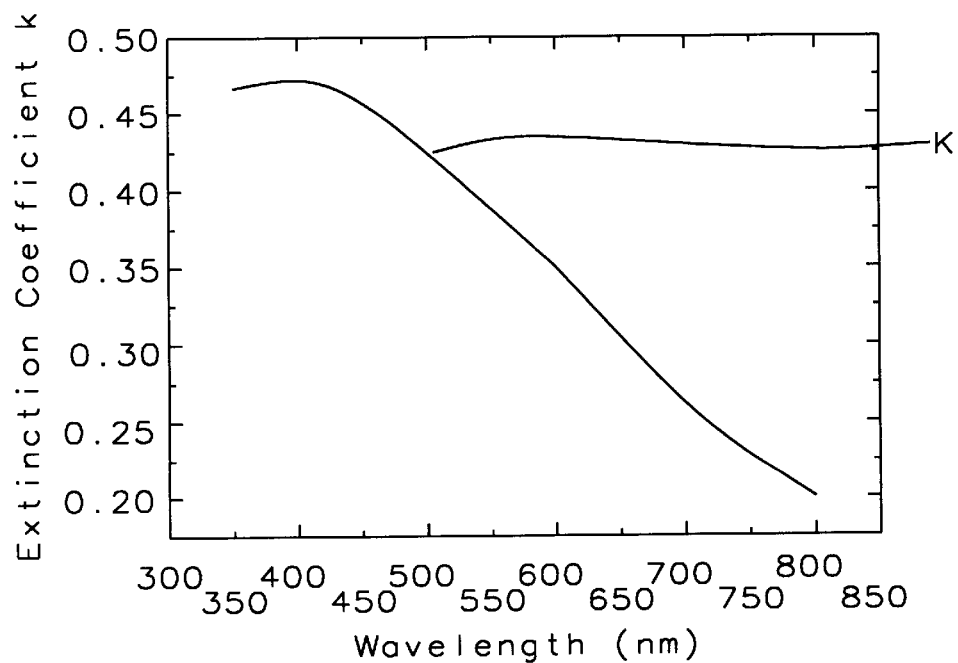
FIG. 8 shows a curve of the extinction coefficient as a function of light wavelength for a film of $(LaNiO_3)_x(TiO_2)_{1-x}$.
Figure 9:
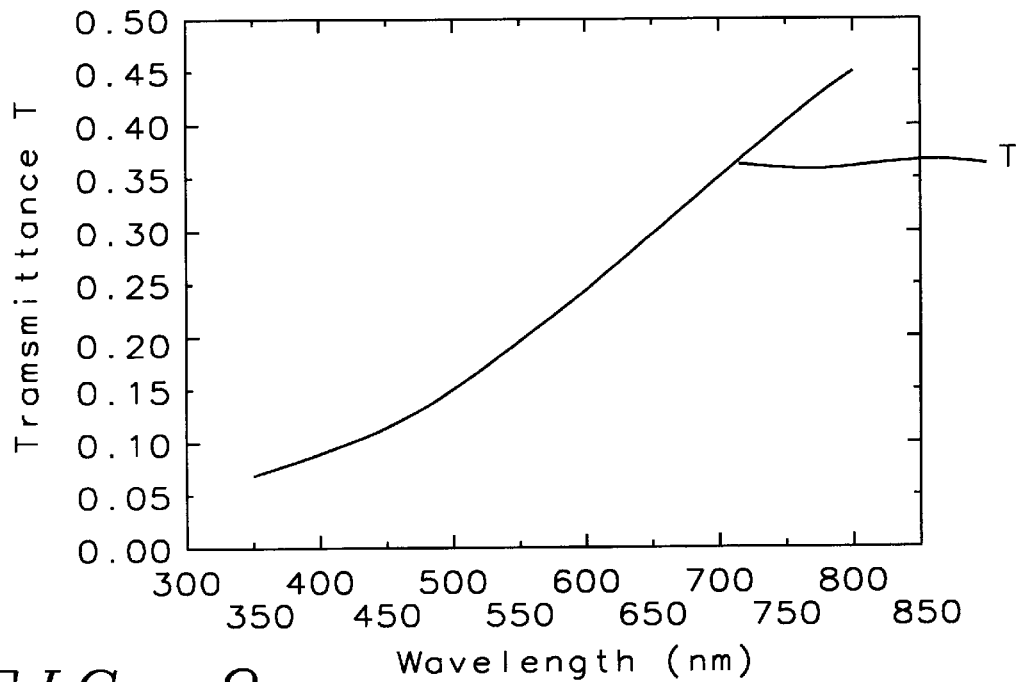
FIG. 9 shows a curve of the transmittance as a function of light wavelength for a film of $(LaNiO_3)_x(TiO_2)_{1-x}$ having a 180° phase shift at 365 nanometers.
Figure 10:
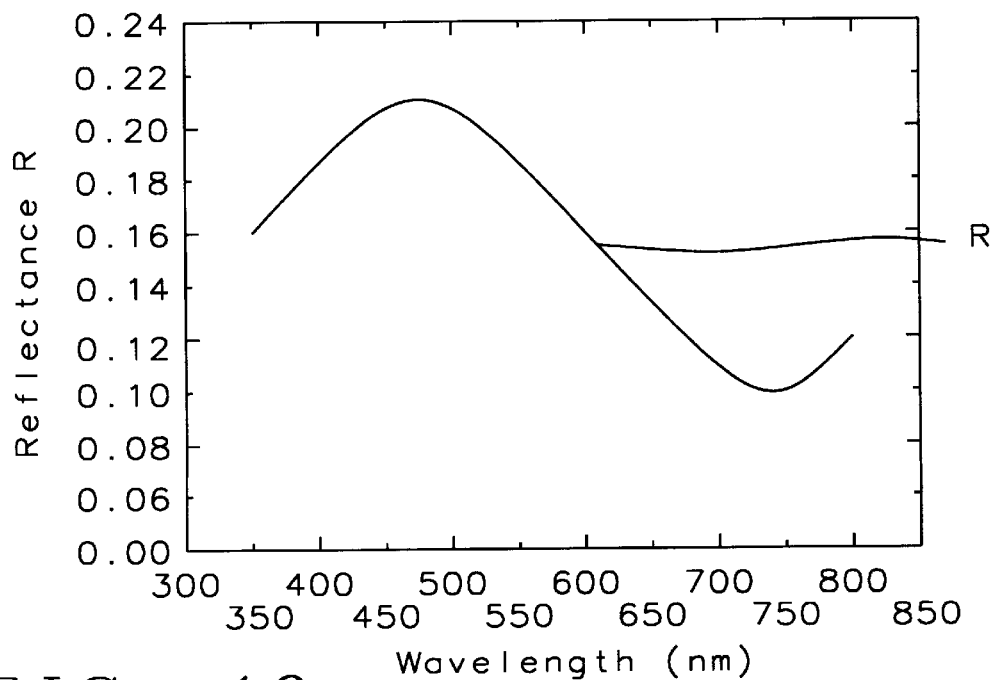
FIG. 10 shows a curve of the reflectance as a function of light wavelength for a film of $(LaNiO_3)_x(TiO_2)_{1-x}$ having a 180° phase shift at 365 nanometers.

The attenuating phase shifting layer must provide an optical phase shift of about 180°, which will depend in part on the thickness of the film. The thickness is given by (m+½) multiplied by the wavelength of the light used divided by the difference between the index of refraction of the LNTO film and the index of refraction of air, where m is an integer having values 0, 1, 2, 3 etc. FIGS. 7–10 show the optical properties of a LNTO film having a thickness which provides a 180° phase shift at the i-line wavelength of 365 nanometers. FIG. 7 shows the index of refraction, n, FIG. 8 the extinction coefficient, k, FIG. 9 the transmittance, T, and FIG. 10 the reflectance, R, of a LNTO film having a thickness which provides a 180° phase shift at the i-line wavelength of 365 nanometers. It can be seen from FIG. 9 that the $(LaNiO_3)_x(TiO_2)_{1-x}$ film satisfies the objectives of forming a single layer composite attenuating phase shifting material having a transmittance of about 0.15 or less for light having a wavelength of about 365 nanometers or less and about 0.40 or less for light having a wavelength of about 623 nanometers or less.

A LNTO film having a thickness of about 141 nanometers will provide a phase shift of 180° and a transmittance of about 0.05 for light from an i-line light source having a wavelength of 365 nanometers and a transmittance of about 0.25 for light having a wavelength of 600 nanometers.

A LNTO film will have an index of refraction of between about 2.1 and 2.3 and an extinction coefficient of between about 0.35 and 0.55 for light having a wavelength between about 350 nanometers and 600 nanometers. This range of index of refraction and extinction coefficient will provide the desired transmittance of less than 0.15 when the thickness of the LNTO film is adjusted to provide a 180° optical phase shift for light having the i-line wavelength of 365 nanometers, a transmittance of less than 0.30 for light of about 600 nanometers, and a reflectance of less than 0.20 which will improve mask alignment.

As shown in FIG. 6, the attenuating phase shifting mask is completed by forming a pattern in the layer of attenuating phase shifting material 25, such as LNTO described above, which has been formed on the transparent substrate 22.

Figure 5:
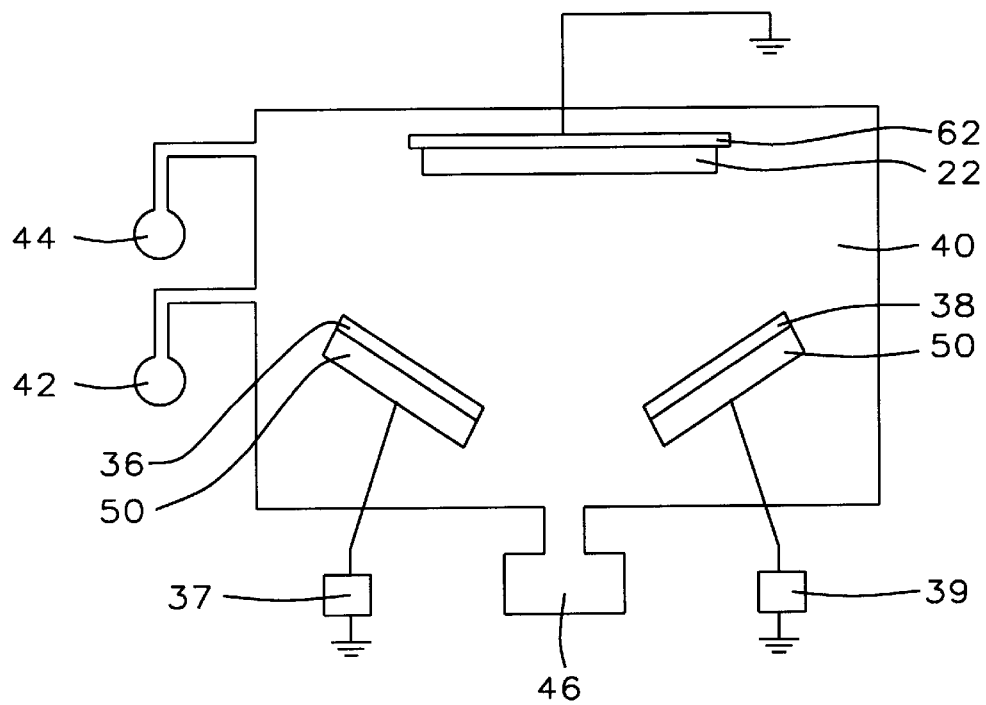
FIG. 5 shows a block diagram of an rf magnetron sputtering apparatus used to deposit the attenuating phase shifting material of this invention.

Refer now to FIGS. 4–6, there is shown an embodiment of a method of forming the attenuating phase shifting mask of this invention. As shown in FIG. 4 a first material having a large extinction coefficient, k, greater than about 0.8, and a second material having a high index of refraction, n, greater than about 2.4 are co-deposited on a transparent substrate 22. In this embodiment the first material is $LaNiO_3$, the second material is Ti, the transparent substrate is quartz, and the first and second materials are co-deposited using rf magnetron sputtering.

Refer now to FIG. 5, there is shown a block diagram of a sputtering system for accomplishing the rf magnetron sputtering. As shown in FIG. 5 the quartz substrate 22 is placed on a grounded surface 62 in the sputtering chamber 40. Magnets 50 supply the magnetic field for the magnetron sputtering. A $LaNiO_3$ target 36 and a Ti target 38 are placed in the sputtering chamber. The $LaNiO_3$ target 36 is connected to a first rf power supply 37 and the Ti target 38 is connected to a second rf power supply 39. A source of oxygen 42 and a source of argon 44 are connected to the sputtering chamber. A vacuum pump 46 is connected to the sputtering chamber 40 and controls the pressure in the chamber.

For the co-deposition of $LaNiO_3$ and $TiO_2$ the first rf power supply 37 supplies between about 2.47 and 3.45 watts/cm² to the $LaNiO_3$ source 36, the second power supply 39 supplies between about 7.0 and 9.0 watts/cm² to the Ti source 38, the pressure in the sputtering chamber is controlled by the vacuum pump 36 at about 10 mTorr, the oxygen flow rate is between about 5 and 6 sccm or standard cubic centimeters per minute, and the argon flow rate is about 45 sccm. This co-deposition results in a film comprising primarily $(LaNiO_3)_x(TiO_2)_{1-x}$, or LNTO, where x is between about 0.5 and 0.8. The LNTO film deposited in this manner will have an index of refraction, n, of between about 2.1 and 2.3 and an extinction coefficient, k, of between about 0.35 and 0.55. The thickness 32, see FIG. 4, of the LNTO film is adjusted to provide a 180° phase shift for the wavelength of light which will be used to illuminate the mask. For an i-line source having a wavelength of 365 nanometers the thickness 32 will be about 100 nanometers to 200 nanometers.

Figure 1:
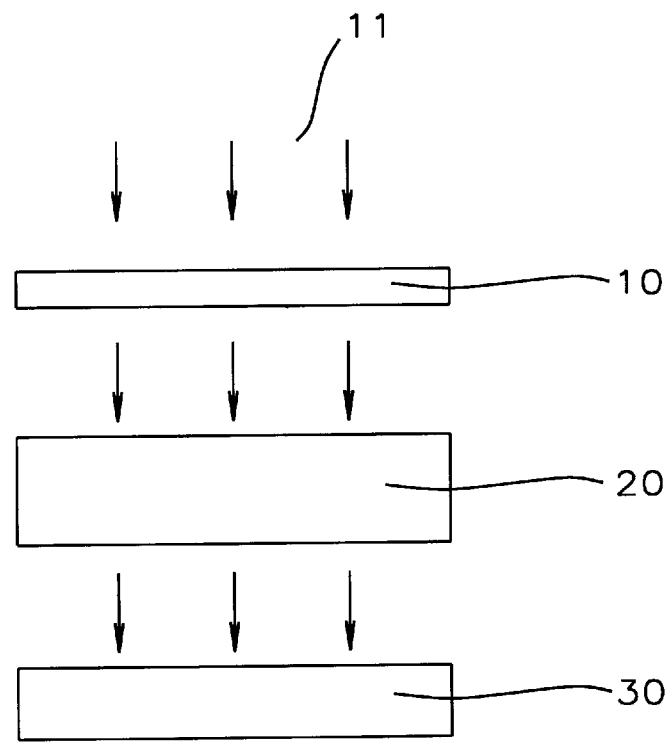
FIG. 1 is a block diagram of a conventional reduction stepper for forming a mask image on an integrated circuit wafer.
Figure 2:
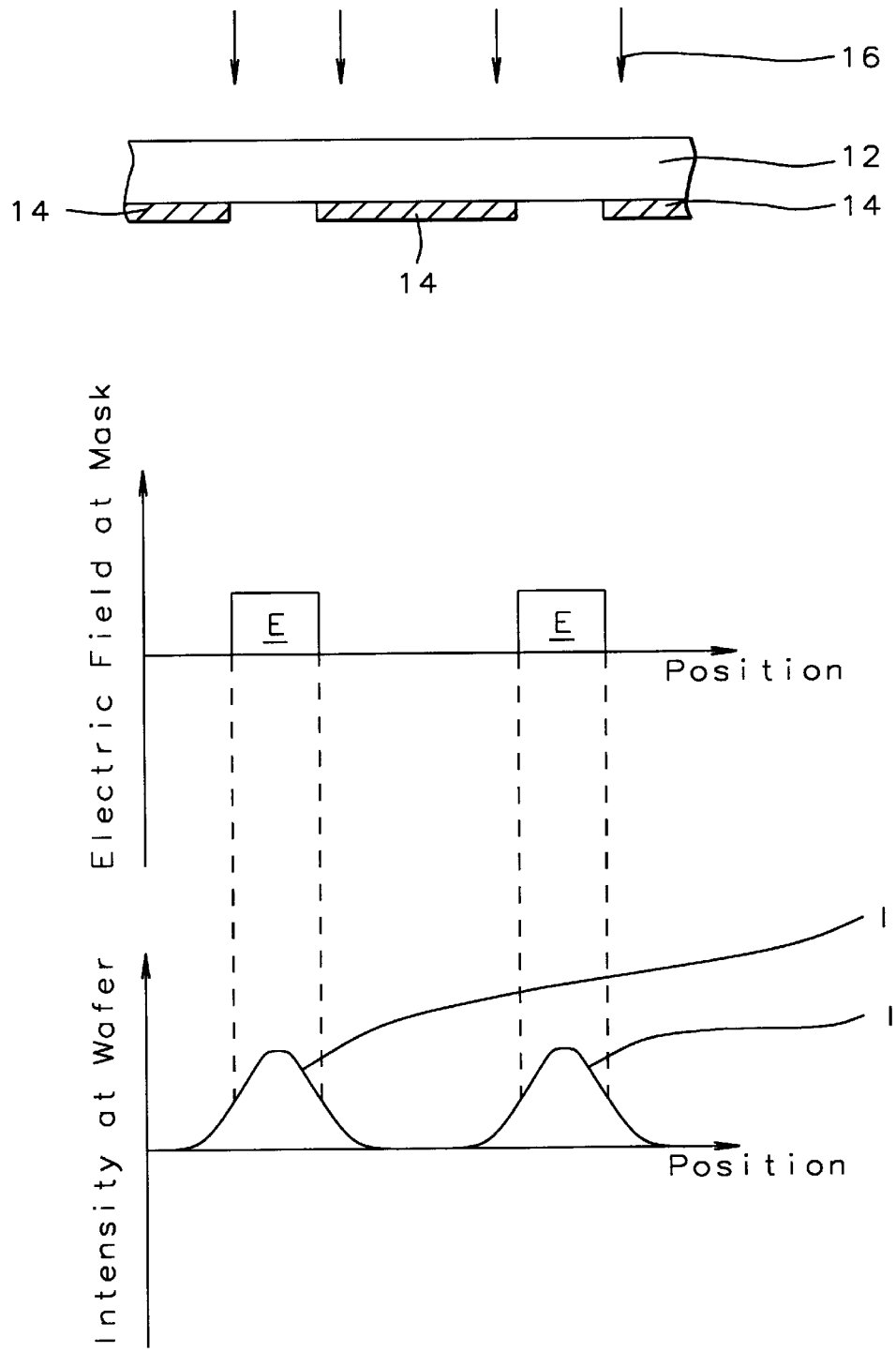
FIG. 2 shows a cross section view of a prior art binary mask, the electric field of the light emerging from the mask, and the intensity of the light at the integrated circuit wafer.
Figure 3:
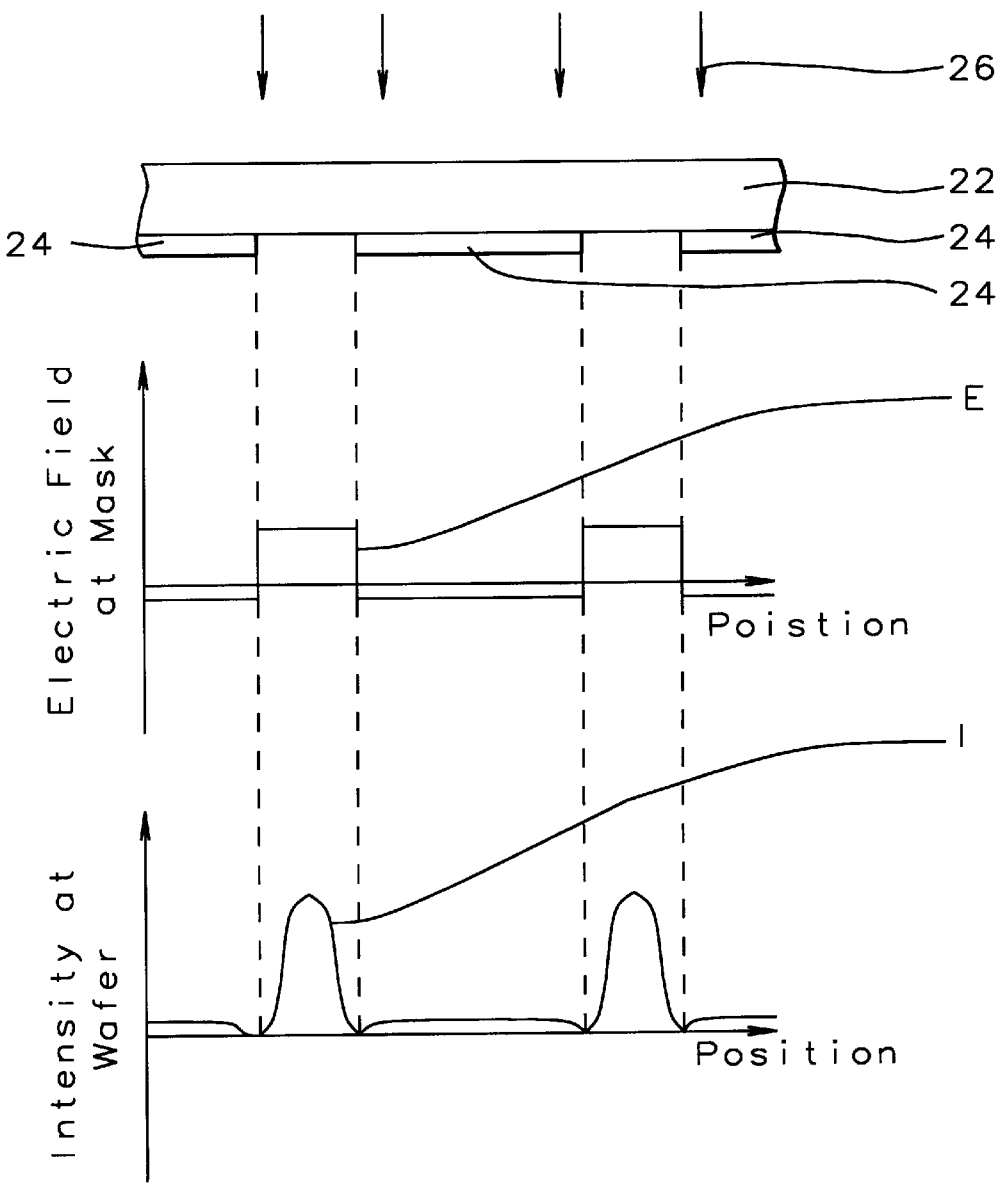
FIG. 3 shows a cross section view of a prior art attenuating phase shifting mask, the electric field of the light emerging from the mask, and the intensity of the light at the integrated circuit wafer.

As shown in FIG. 6 a pattern is formed in the LNTO layer 25 which has been formed on the transparent quartz substrate 22. The mask is then completed and is used in a reduction stepper as shown in FIG. 1 and described earlier.

Refer now to FIGS. 4–6, there is shown another embodiment of a method of forming the attenuating phase shifting mask of this invention. As shown in FIG. 4 a first material having a large extinction coefficient, k, greater than about 0.7, and a second material having a high index of refraction, n, greater than about 2.0 are co-deposited on a transparent substrate 22. In this embodiment the first material is $LaNiO_3$, the second material is $Ta_2O_5$, the transparent substrate is quartz, and the first and second materials are co-deposited using rf magnetron sputtering.

Refer now to FIG. 5, there is shown a block diagram of a sputtering system for accomplishing the rf magnetron sputtering. As shown in FIG. 5 the quartz substrate 22 is placed on a grounded surface 62 in the sputtering chamber 40. Magnets 50 supply the magnetic field for the magnetron sputtering. A $LaNiO_3$ target 36 and a Ta target 38 are placed in the sputtering chamber. The materials will be deposited in the presence of oxygen and argon and the material from the Ta target 38 will deposit as $Ta_2O_5$. The $LaNiO_3$ target 36 is connected to a first rf power supply 37 and the Ta target 38 is connected to a second rf power supply 39. A source of oxygen 42 and a source of argon 44 are connected to the sputtering chamber. A vacuum pump 46 is connected to the sputtering chamber 40 and controls the pressure in the chamber.

For the co-deposition of $LaNiO_3$ and $Ta_2O_5$ the first rf power supply 37 supplies between about 72 and 88 watts to the $LaNiO_3$ source 36 and the second power supply 39 supplies between about 25 and 45 watts to the Ti source 38. This co-deposition results in a film comprising primarily $(LaNiO_3)_x(Ta_2O_5)_{1-x}$. The $(LaNiO_3)_x(Ta_2O_5)_{1-x}$ film deposited in this manner will have an index of refraction, n, of between about 1.6 and 2.5 and an extinction coefficient, k, of between about 0.10 and 0.70. The thickness 32, see FIG. 4, of the film is adjusted to provide a 180° phase shift for the wavelength of light which will be used to illuminate the mask. For an i-line source having a wavelength of about 365 nanometers the thickness 32 will be between about 170 nanometers and 225 nanometers. For a deep ultraviolet source having a wavelength of about 248 nanometers the thickness 32 will be between about 105 nanometers and 165 nanometers.

Figure 11:
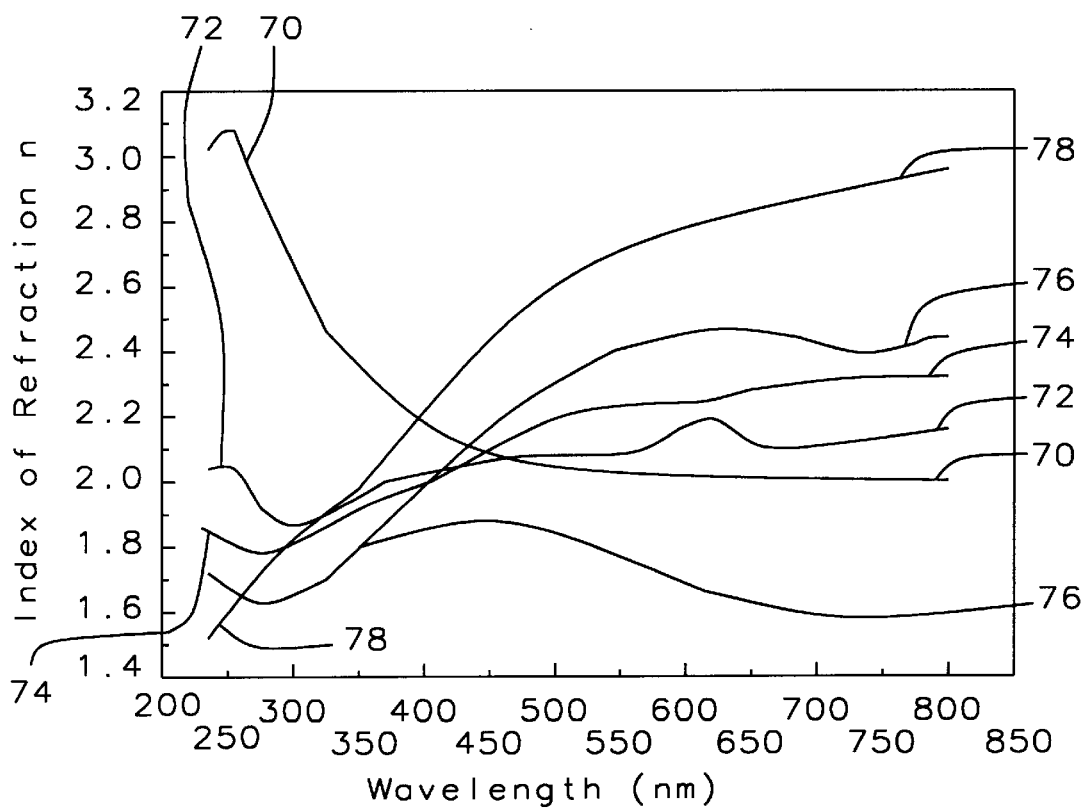
FIG. 11 shows curves of the index of refraction as a function of light wavelength for films of $LaNiO_3$, $Ta_2O_5$, and three compositions of $(LaNiO_3)_x(Ta_2O_5)_{1-x}$.

FIG. 11 shows the index of refraction, n, as a function of wavelength of light for a number of films. FIG. 11 shows a curve of the index of refraction, n, as a function of wavelength for an $LaNiO_3$ film 78 and a curve of the index of refraction, n, as a function of wavelength for a $Ta_2O_5$ film 70. FIG. 11 also shows curves of the index of refraction, n, as a function of wavelength for a $(LaNiO_3)_x(Ta_2O_5)_{1-x}$ film deposited using about 80 watts supplied to the $LaNiO_3$ target and about 30 watts supplied to the Ta target, reference number 76; a $(LaNiO_3)_x(Ta_2O_5)_{1-x}$ film deposited using about 80 watts supplied to the $LaNiO_3$ target and about 35 watts supplied to the Ta target, reference number 74; and a $(LaNiO_3)_x(Ta_2O_5)_{1-x}$ film deposited using about 80 watts supplied to the $LaNiO_3$ target and about 40 watts supplied to the Ta target, reference number 72.

Figure 12:
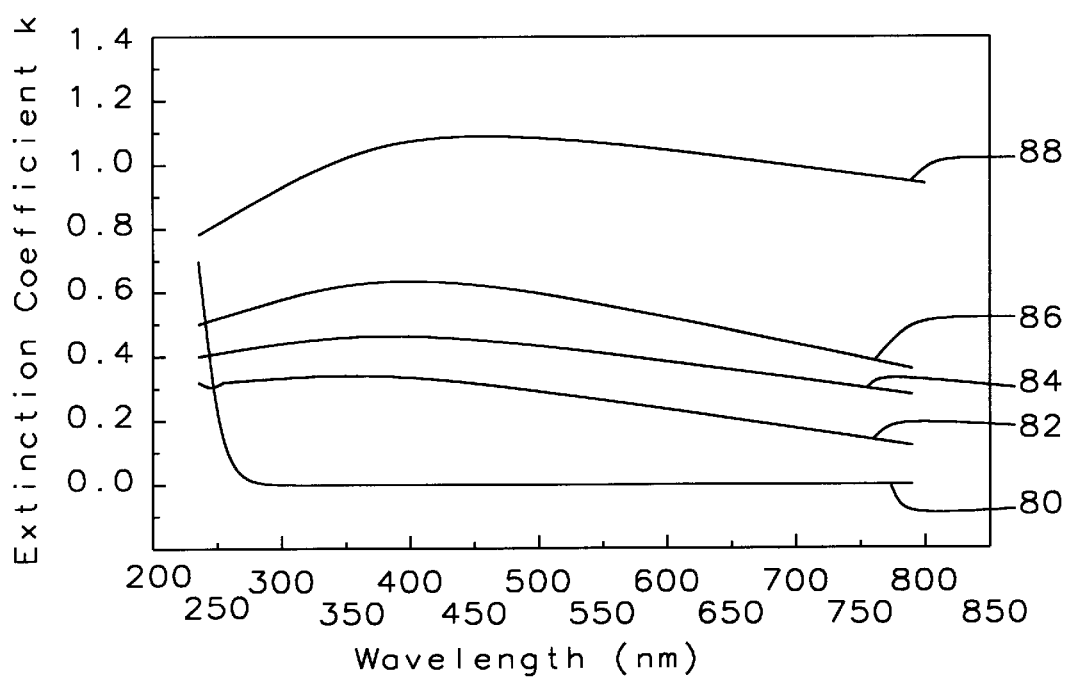
FIG. 12 shows curves of the extinction coefficient as a function of light wavelength for films of $LaNiO_3$, $Ta_2O_5$, and three compositions of $(LaNiO_3)_x(Ta_2O_5)_{1-x}$.

FIG. 12 shows the extinction coefficient, k, as a function of wavelength of light for a number of films. FIG. 12 shows a curve of the extinction coefficient, k, as a function of wavelength for a $LaNiO_3$ film 88 and a curve of the extinction coefficient, k, as a function of wavelength for a $Ta_2O_5$ film 80. FIG. 12 also shows curves of the extinction coefficient, k, as a function of wavelength for a $(LaNiO_3)_x(Ta_2O_5)_{1-x}$ film deposited using about 80 watts supplied to the $LaNiO_3$ target and about 30 watts supplied to the Ta target, reference number 86; a $(LaNiO_3)_x(Ta_2O_5)_{1-x}$ film deposited using about 80 watts supplied to the $LaNiO_3$ target and about 35 watts supplied to the Ta target, reference number 84; and a $(LaNiO_3)_x(Ta_2O_5)_{1-x}$ film deposited using about 80 watts supplied to the $LaNiO_3$ target and about 40 watts supplied to the Ta target, reference number 82.

Figure 13:
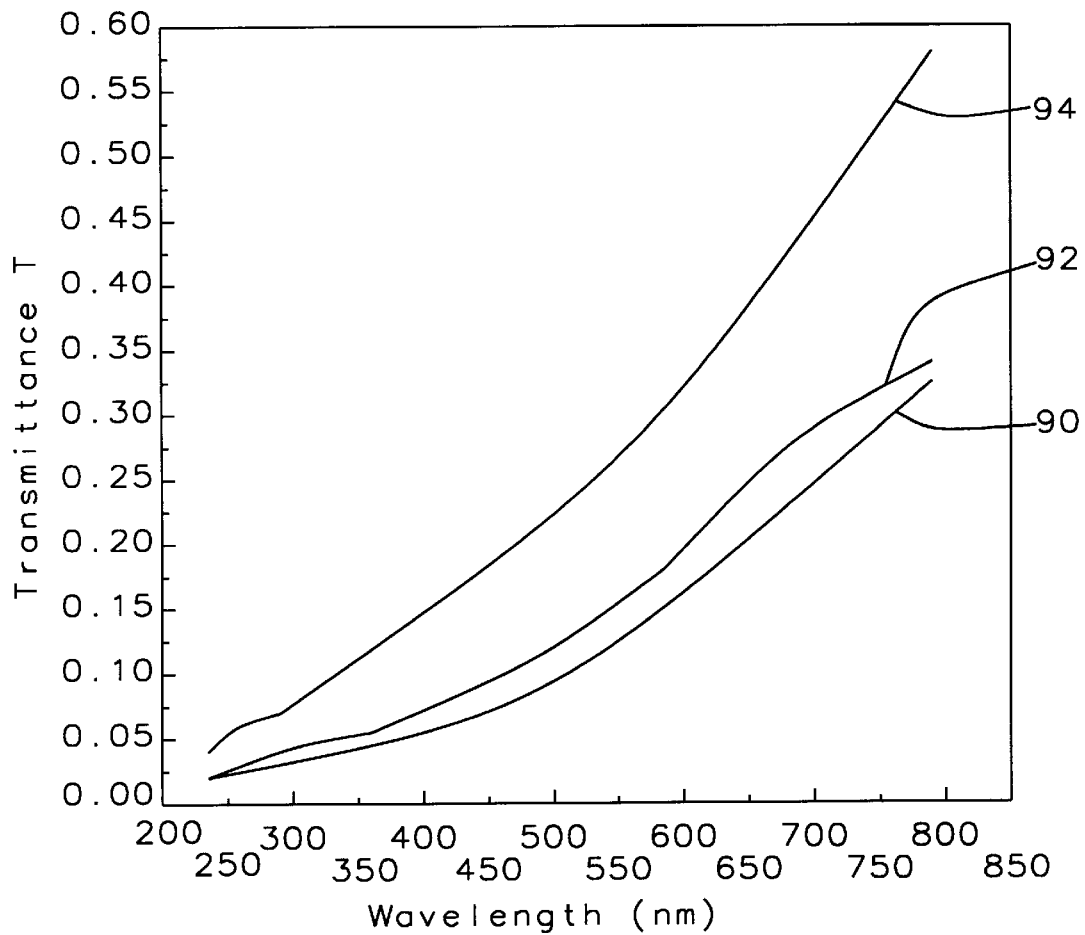
FIG. 13 shows curves of the transmittance as a function of light wavelength for films having three compositions of $(LaNiO_3)_x(Ta_2O_5)_{1-x}$ wherein each film has a 180° phase shift at a wavelength of 365 nanometers.

FIG. 13 shows curves of the transmittance as a function of wavelength for three $(LaNiO_3)_x(Ta_2O_5)_{1-x}$ films having a thickness adjusted to provide a 180° phase shift for light having a wavelength of about 365 nanometers deposited under different conditions. FIG. 13 shows curves of transmittance as a function of wavelength for a $(LaNiO_3)_x(Ta_2O_5)_{1-x}$ film deposited using about 80 watts supplied to the $LaNiO_3$ target and about 35 watts supplied to the Ta target with an oxygen flow rate of about 20 sccm and an argon flow rate of about 80 sccm, reference number 90; a $(LaNiO_3)_x(Ta_2O_5)_{1-x}$ film deposited using about 80 watts supplied to the $LaNiO_3$ target and about 40 watts supplied to the Ta target with an oxygen flow rate of about 20 sccm and an argon flow rate of about 80 sccm, reference number 94; and a $(LaNiO_3)_x(Ta_2O_5)_{1-x}$ film deposited using about 50 watts supplied to the $LaNiO_3$ target and about 25 watts supplied to the Ta target with an oxygen flow rate of about 15 sccm and an argon flow rate of about 85 sccm, reference number 92.

It can be seen from FIG. 13 that a $(LaNiO_3)_x(Ta_2O_5)_{1-x}$ film deposited using about 80 watts supplied to the $LaNiO_3$ target and about 35 watts supplied to the Ta target with an oxygen flow rate of about 20 sccm and an argon flow rate of about 80 sccm, reference number 90; and a $(LaNiO_3)_x(Ta_2O_5)_{1-x}$ film deposited using about 50 watts supplied to the $LaNiO_3$ target and about 25 watts supplied to the Ta target with an oxygen flow rate of about 15 sccm and an argon flow rate of about 85 sccm, reference number 92 satisfy the objectives of forming a single layer composite attenuating phase shifting material having a transmittance of about 0.15 or less for light having a wavelength of about 365 nanometers or less and about 0.40 or less for light having a wavelength of about 623 nanometers or less.

Figure 14:
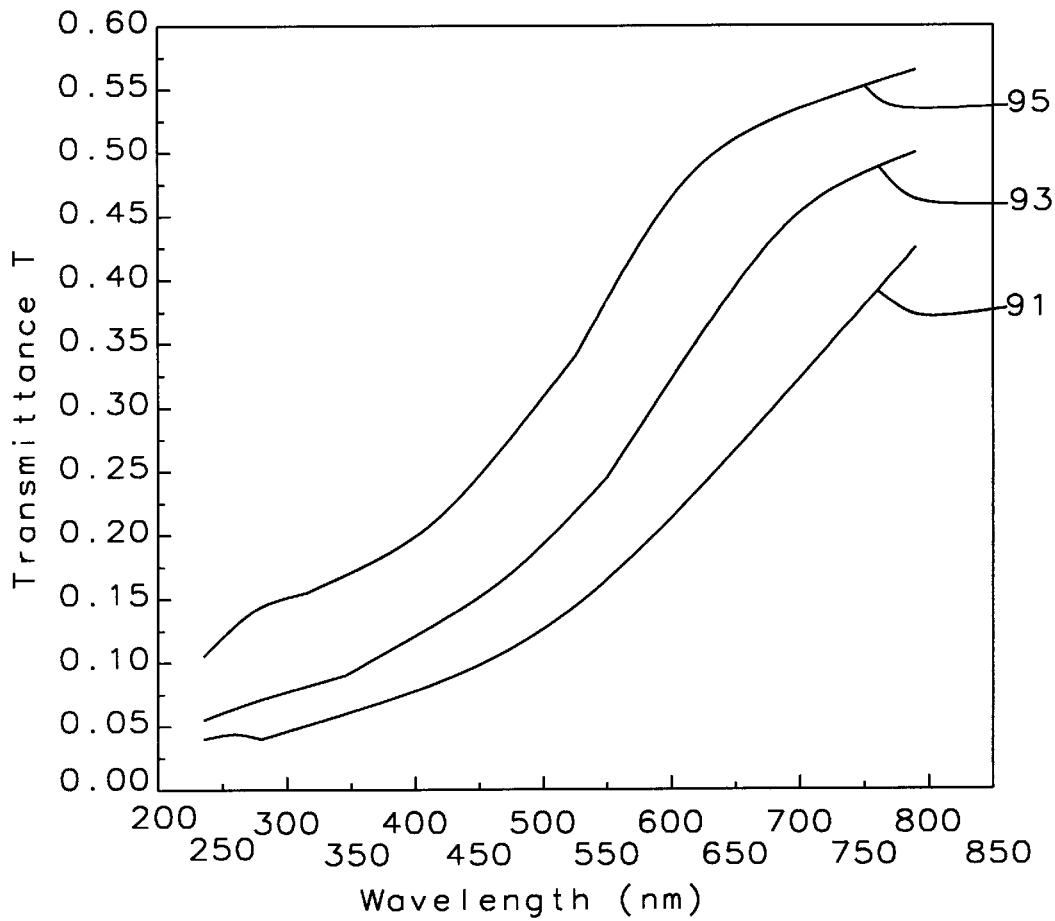
FIG. 14 shows curves of the transmittance as a function of light wavelength for films having three compositions of $(LaNiO_3)_x(Ta_2O_5)_{1-x}$ wherein each film has a 180° phase shift at a wavelength of 248 nanometers.

FIG. 14 shows curves of the transmittance as a function of wavelength for three $(LaNiO_3)_x(Ta_2O_5)_{1-x}$ films having a thickness adjusted to provide a 180° phase shift for light having a wavelength of about 248 nanometers deposited under different conditions. FIG. 14 shows curves of transmittance as a function of wavelength for a $(LaNiO_3)_x(Ta_2O_5)_{1-x}$ film deposited using about 80 watts supplied to the $LaNiO_3$ target and about 35 watts supplied to the Ta target with an oxygen flow rate of about 20 sccm and an argon flow rate of about 80 sccm, reference number 91; a $(LaNiO_3)_x(Ta_2O_5)_{1-x}$ film deposited using about 80 watts supplied to the $LaNiO_3$ target and about 40 watts supplied to the Ta target with an oxygen flow rate of about 20 sccm and an argon flow rate of about 80 sccm, reference number 95; and a $(LaNiO_3)_x(Ta_2O_5)_{1-x}$ film deposited using about 50 watts supplied to the $LaNiO_3$ target and about 25 watts supplied to the Ta target with an oxygen flow rate of about 15 sccm and an argon flow rate of about 85 sccm, reference number 93.

It can be seen from FIG. 14 that a $(LaNiO_3)_x(Ta O_5)_{1-x}$ film deposited using about 80 watts supplied to the $LaNiO_3$ target and about 35 watts supplied to the Ta target with an oxygen flow rate of about 20 sccm and an argon flow rate of about 80 sccm, reference number 91; and a $(LaNiO_3)_x(Ta_2O_5)_{1-x}$ film deposited using about 50 watts supplied to the $LaNiO_3$ target and about 25 watts supplied to the Ta target with an oxygen flow rate of about 15 sccm and an argon flow rate of about 85 sccm, reference number 93 satisfy the objectives of forming a single layer composite attenuating phase shifting material having a transmittance of about 0.15 or less for light having a wavelength of about 365 nanometers or less and about 0.40 or less for light having a wavelength of about 623 nanometers or less.

Refer now to FIGS. 4 and 6, there is shown another embodiment of the attenuating phase shifting photomask of this invention. FIG. 4 shows a cross section of a transparent mask substrate 22, such as fused quartz, with a layer of attenuating phase shifting material 25 formed thereon. The attenuating phase shifting material is a composite material comprising a first material, such as $LaNiO_3$, having a large extinction coefficient, k, greater than about 0.8, and a second material, such as $Ta_2O_5$, having a high index of refraction, n, greater than about 2.0. The extinction coefficient, k, is the imaginary part of the index of refraction and is related to the transmission coefficient of the material but does not depend on the material thickness.

Referring again to FIG. 4, the single layer composition of $(LaNiO_3)_x(Ta_2O_5)_{1-x}$ is an attenuating phase shifting material 25 with particular usefulness in lithography using an i-line sight source, 365 nanometers, or a deep ultraviolet light source, 248 nanometers. For an i-line light source, 365 nanometers, the $(LaNiO_3)_x(Ta_2O_5)_{1-x}$ film has a thickness 32 of between about 170 nanometers and 225 nanometers. For a deep ultraviolet light source, 248 nanometers, the $(LaNiO_3)_x(Ta_2O_5)_{1-x}$ film has a thickness 32 of between about 105 nanometers and 165 nanometers.

As shown in FIG. 6 a pattern is formed in the layer of $(LaNiO_3)_x(Ta_2O_5)_{1-x}$ 25 which has been formed on the transparent quartz substrate 22. The mask is then completed and is used in a reduction stepper as shown in FIG. 1 and described earlier.

While the invention has been particularly shown and described with reference to the preferred embodiments thereof, it will be understood by those skilled in the art that various changes in form and details may be made without departing from the spirit and scope of the invention.

What is claimed is:

1. An attenuating phase shifting mask, comprising:
    a transparent mask substrate;
    a patterned layer of attenuating phase shifting material formed on said transparent mask substrate, wherein said layer of attenuating phase shifting material is a layer of $(LaNiO_3)_x(Ta_2O_5)_{1-x}$, said layer of $(LaNiO_3)_x(Ta_2O_5)_{1-x}$ having a transmittance of about 0.15 or less for light having a wavelength of about 365 nanometers or less and a transmittance of about 0.40 or less for light having a wavelength of about 623 nanometers or less.

2. The attenuating phase shifting mask of claim 1 wherein said layer of $(LaNiO_3)_x(Ta_2O_5)_{1-x}$ provides a 180° shift for light having a wavelength of about 365 nanometers.

3. The attenuating phase shifting mask of claim 1 wherein said layer of $(LaNiO_3)_x(Ta_2O_5)_{1-x}$ has a thickness of between about 170 nanometers and 225 nanometers.

4. The attenuating phase shifting mask of claim 1 wherein said layer of $(LaNiO_3)_x(Ta_2O_5)_{1-x}$ provides a 180° shift for light having a wavelength of about 248 nanometers.

5. The attenuating phase shifting mask of claim 1 wherein said layer of $(LaNiO_3)_x(Ta_2O_5)_{1-x}$ has a thickness of between about 105 nanometers and 165 nanometers.

6. An attenuating phase shifting material, comprising:
    a layer of $(LaNiO_3)_{1-x}Ta_2O_5)_{1-x}$ said layer of $(LaNiO_3)_x(Ta_2O_5)_{1-x}$ having a transmittance of about 0.15 or less for light having a wavelength of about 365 nanometers or less and a transmittance of about 0.40 or less for light having a wavelength of about 623 nanometers or less.

7. The attenuating phase shifting material of claim 6 wherein said layer of $(LaNiO_3)_x(Ta_2O_5)_{1-x}$ provides a 180° shift for light having a wavelength of about 365 nanometers.

8. The attenuating phase shifting material of claim 6 wherein said layer of $(LaNiO_3)_x(Ta_2O_5)_{1-x}$ has a thickness of between about 170 nanometers and 225 nanometers.

9. The attenuating phase shifting material of claim 6 wherein said layer of $(LaNiO_3)_x(Ta_2O_5)_{1-x}$ provides a 180° shift for light having a wavelength of about 248 nanometers.

10. The attenuating phase shifting material of claim 6 wherein said layer of $(LaNiO_3)_x(Ta_2O_5)_{1-x}$ has a thickness of between about 105 nanometers and 165 nanometers.

11. A method of forming an attenuating phase shifting mask, comprising the steps of:
    providing a transparent mask substrate;
    forming a layer of attenuating phase shifting material formed on said transparent mask substrate, wherein said layer of attenuating phase shifting material is a a layer of $(LaNiO_3)_x(Ta_2O_5)_{1-x}$, said layer of $(LaNiO_3)_x(Ta_2O_5)_{1-x}$ having a transmittance of about 0.15 or less for light having a wavelength of about 365 nanometers or less and a transmittance of about 0.40 or less for light having a wavelength of about 623 nanometers or less; and
    forming a pattern in said layer of attenuating phase shifting material.

12. The method of claim 11 wherein said layer of $(LaNiO_3)_x(Ta_2O_5)_{1-x}$ is formed by co-depositing $LaNiO_3$ and $Ta_2O_5$ using rf-magnetron sputtering.

13. The method of claim 11 wherein said layer of $(LaNiO_3)_x(Ta_2O_5)_{1-x}$ is formed using a dual-gun rf-magnetron sputtering system, a $LaNiO_3$ target, a Ta target, and a sputter gas comprising a mixture of oxygen and argon.

14. The method of claim 11 wherein said layer of $(LaNiO_3)_x(Ta_2O_5)_{1-x}$ provides a 180° shift for light having a wavelength of about 365 nanometers.

15. The method of claim 11 wherein said layer of $(LaNiO_3)_x(Ta_2O_5)_{1-x}$ has a thickness of between about 170 nanometers and 225 nanometers.

16. The method of claim 11 wherein said layer of $(LaNiO_3)_x(Ta_2O_5)_{1-x}$ provides a 180° shift for light having a wavelength of about 248 nanometers.

17. The method of claim 11 wherein said layer of $(LaNiO_3)_x(Ta_2O_5)_{1-x}$ has a thickness of between about 105 nanometers and 165 nanometers.

* * * * *